WITNESSES
Leon J. Taza
William L. Gates

INVENTORS
Heber J. Morrison and
Joseph J. Anderson
BY Ernest P. Klipfel
ATTORNEY 3,210,684

PHASE LOCKED VARIABLE FREQUENCY OSCILLATOR SYSTEM WITH SWEEP CIRCUIT

Heber J. Morrison, Ellicott City, and Joseph J. Anderson, Glen Burnie, Md., assignors to Westinghouse Electric Corporation, East Pittsburgh, Pa., a corporation of Pennsylvania Filed May 17, 1962, Ser. No. 195,461
8 Claims. (Cl. 331—4)

This invention relates to a control system for automatic synchronization of the frequency of a variable frequency oscillator and more particularly to an improved system for phase locking the oscillator to a selected harmonic of a reference signal as provided by a frequency spectrum generator producing an output having a pulse like wave shape so that its spectrum of harmonics reaches a very high order.

Control systems are known in which the frequency of a variable frequency oscillator is automatically synchronized with reference oscillation fed to the system when the frequency of the reference oscillator or a harmonic thereof is sufficiently close to the oscillator frequency. By pre-adjusting the tuning, the frequency of the oscillator may be roughly adjusted to a frequency selected from a plurality of given frequencies and compared to a spectrum of reference frequencies containing a plurality of harmonics whereupon a fine tuning device takes over the automatic precision adjustment of the oscillator frequency to lock it in with the selected reference frequency. The fine tuning control means provided for this purpose may for instance be a reactance tube controlled by a voltage control means connected across the frequency determining tuned circuit of the oscillator. The control voltage is derived by heterodyning the oscillator with the spectrum of reference frequencies and providing an alternating correction voltage corresponding with the sum or difference frequency, the polarity of which depends upon the phase or time relationship of the compared oscillations.

Accordingly, present apparatus used to phase lock a frequency variable oscillator to small discrete interval frequencies is accomplished by mixing the output signal of the variable frequency oscillator with a selected stable frequency spectrum to form an IF signal. The frequency spectrum is provided by a reference frequency generator operated in combination with a variable frequency spectrum filter. This signal is then passed through a selected IF strip to a phase detector which includes an input signal from a phase locked interpolation oscillator capable of locking over the required frequency intervals. The output of the interpolation oscillator is then compared to the IF signal in the phase detector and a correction or control voltage is then sent back to the variable frequency oscillator for the necessary correction. This method then requires a stable variable frequency oscillator, a variable spectrum filter, a selected IF strip which is sometimes made variable, and a variable interpolation oscillator.

An object of the present invention is the provision of a new and improved system of phase locking a variable frequency oscillator.

Another object of the present invention is to provide a phase locked variable frequency oscillator system which includes a combined search and locking circuit providing a wide pull-in range, a wide hold-in range, and low response to spurious signals.

Still another object of the present invention is to provide a phase lock control system for a variable frequency oscillator which obviates the necessity for an intermediate frequency stage and includes a simple and reliable automatic sweep and locking circuit.

Other objects and advantages will become apparent after a study of the following specification when read in connection with the accompanying drawings, in which.

The present invention provides a new and novel control system for phase locking a variable frequency oscillator by utilizing two loop networks called a phase loop and a combined sweep and lock loop network. The phase loop network generates a correction voltage for the variable frequency oscillator (VFO) and the sweep and lock loop takes an error signal dependent on the phase relationship between the output of the oscillator and a reference frequency and sends back a feedback signal to the phase loop causing it to hunt or sweep depending upon the magnitude of the error signal. The sweep and lock loop network also provides that when the error signal approaches a zero value signifying a phase or time coincidence between the oscillator output and the reference frequency, means are initiated to alter the frequency response of the phase loop so that it will not be responsive to any spurious signals that would cause unwanted output signals to appear from the variable frequency oscillator.

The present invention also includes means for monitoring the correction voltage by suitable metering circuitry in order that the variable frequency oscillator can be trimmed to an optimum operating point for each selected frequency by observing the meter indication without changing the oscillator frequency.

Figure 1:
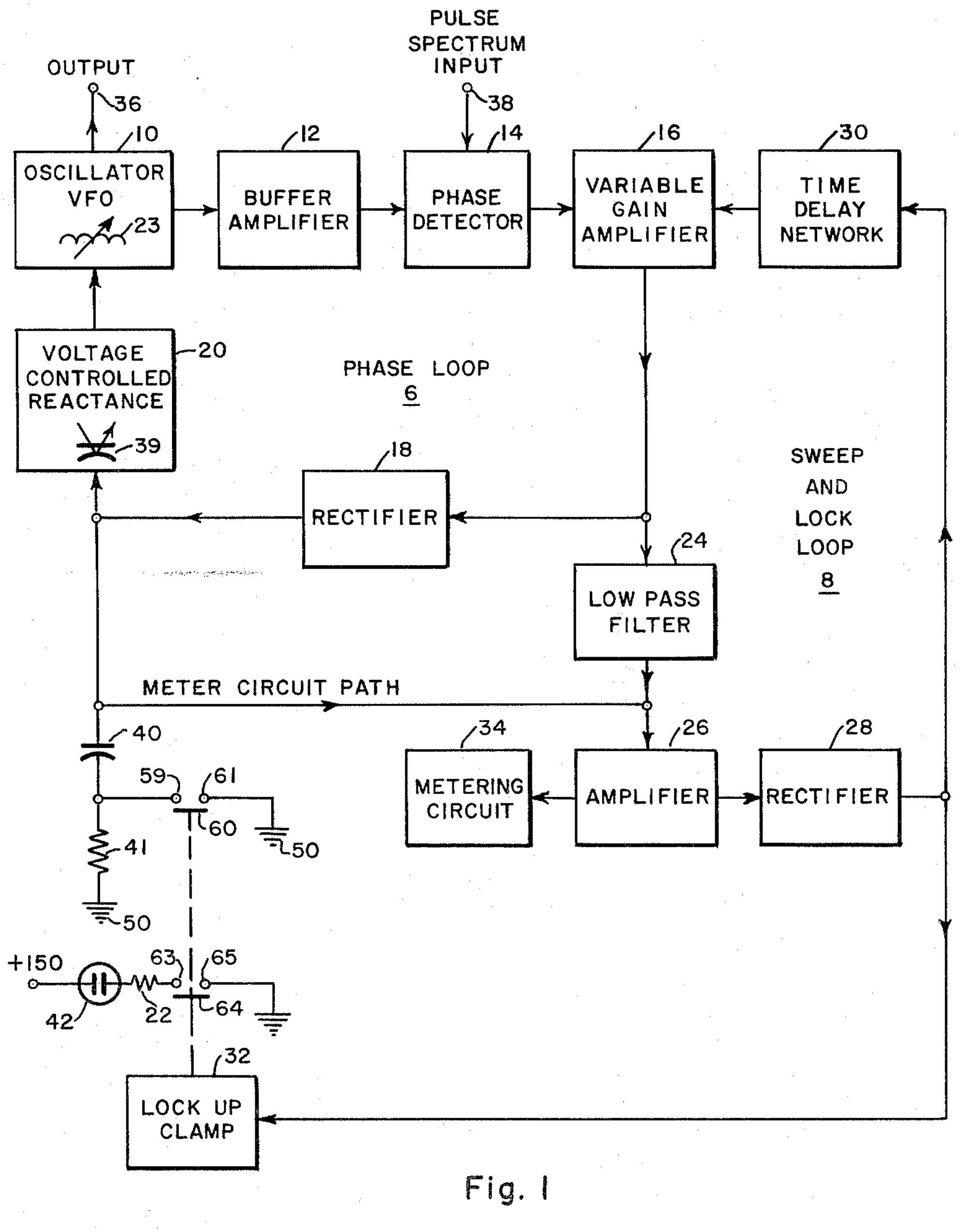
FIGURE 1 is a block diagram illustrating the present invention.

Attention is directed now more particularly to the drawings in which FIG. 1 is a block diagram of the present invention. Considering the phase loop 6, a variable frequency oscillator (VFO) 10 is provided having a mechanically variable coil 23 and a voltage control reactance 20 connected thereto for controlling the frequency of the oscillations. The voltage controlled reactance 20 comprises a voltage variable capacitor 39. The outward signal from the variable frequency oscillator 10 is available at an output terminal 36 and a portion of the oscillator voltage comprising the output signal is fed to a buffer amplifier stage 12 which is used to isolate the oscillator 10 from a phase detector circuit 14. The phase detector 14 is provided with two input signals, one from the variable frequency oscillator and another from a reference signal source, not shown, providing a spectrum of reference frequencies used to phase lock the VFO 10. The output signal of the phase detector 14 is coupled to a variable gain amplifier circuit 16 where it is amplified and applied simultaneously to a rectifier circuit 18 and a low pass filter 24. The portion of the phase detector output signal applied to the rectifier circuit 18 is converted into a D.C. control voltage and this voltage is fed to the voltage controlled reactance 20 for changing the frequency of the VFO 10 or maintaining the frequency at a predetermined point. The spectrum of frequencies applied to the phase detector 14 appears as a series of pulses having a repetition rate of 1 kilocycle per second (kc.). The spectrum then consists of a fundamental wave having a frequency of 1 kc. and a plurality of harmonics—i.e., waves having frequencies in multiples of 1 kc. The variable frequency oscillator 10 operates over a range from 3.455 to 2.455 megacycles per second (mc.). Since the spectrum applied to the phase detector 14 is in the form of a 1 kc. pulse, there are 1000 discrete frequency points per second at which the output voltage from the variable frequency oscillator 10 will be in phrase with the frequency spectrum. If there is a phase or time coincidence relationship between the VFO oscillations and a predetermined harmonic of the pulse spectrum, that is, when the pulse applied to the phase detector 14 appears at an identical point or points in each wave of the oscillator voltage, the signal appearing at the output of the phase detector is a 1 kc. pulse, the amplitude of which is proportional to the D.C. voltage required to be applied to the voltage variable reactance 20 to hold the VFO 10 frequency at the desired frequency. The VFO 10 is then said to be phase locked to a reference frequency provided by the pulse spectrum.

Considering the phase loop network 6 in the unlocked condition, the output voltage of the VFO 10 applied to the phase detector 14 from the buffer amplifier 12 will lack a time coincidence with a harmonic from the spectrum of frequencies provided by the pulse input such that pulses will appear at random positions along the VFO oscillations and a low audio beat signal will appear at the output of the phase detector 14 having a fundamental frequency between the limits of 0 and 500 cycles per second. The frequency of the audio beat signal will be the difference between the VFO 10 frequency and the nearest harmonic of the 1 kc. fundamental wave of the pulse spectrum. The output signal of the phase detector is amplified in the variable gain amplifier 16 and applied to the rectifier 18 which in this instance converts the low audio beat signal into a D.C. control voltage which is applied to the voltage controlled reactance 20 to change the frequency of the oscillator.

In addition to the phase loop 6, the subject invention also includes a combined sweep and lock loop network 8 which enables the VFO 10 to seek out the nearest harmonic or 1 kc. point of the pulse spectrum and upon sensing the closest harmonic, locking on to it. The sweep and lock loop 8 is also shown in FIG. 1 and comprises the variable gain amplifier circuit 16 connected to the low pass filter 24 which in turn is connected to a second amplifier circuit 26. Amplifier 26 is in turn connected to a second rectifier circuit 28 and then to a time delay network 30. From the delay network 30 there is a connection back to amplifier 16.

In operation the low audio beat signal coming from the output of the variable gain amplifier 16 in the unlocked condition, as previously described, is fed into the low pass filter network 24 which separates the low frequency beat signal from any undesired noise or pulse signals that may leak through amplifier 16. The output of the low pass filter is further amplified in amplifier 26 for the purposes of providing a sufficient signal level to the rectifier 28 which converts the beat signal to a D.C. bias voltage for the variable gain amplifier 16 and the lock up clamp circuit 32. The bias voltage applied to amplifier 16 is passed through the time delay network 30 prior to application thereto and this delay in conjunction with the change of gain of the amplifier as caused by the bias voltage sets up a low automatic sweeping action in the phase loop 6. When the variable frequency oscillator is tuned close enough for the phase loop to lock, the low audio beat signal reduces in amplitude to a value approaching zero and the system settles to a steady state. The lock up clamp circuit 32 which is held inactive during the sweeping action due to the D.C. bias applied thereto operates when the bias is reduced along with the beat signal closing the relay contacts shown returning capacitor 40 to ground potential 50. By returning capacitor 40 to ground the frequency response of the phase loop is decreased in order to hold the phase loop in a locked position so that any spurious signals will not allow the oscillator to move from its tuned position. Also upon the removal of the D.C. bias voltage from the clamp circuit 32 an indicator light is turned on by means of another set of relay contacts providing a visual indication of the phase lock condition.

Included in the present invention additionally is a metering circuit 34 which monitors the D.C. control voltage in the phase loop 6. A portion of the voltage from rectifier circuit 18 is fed to the second amplifier 26 and thence to the metering circuit 34. This allows a trimming of the VFO 10 to an optimum operating point for the particular frequency selected.

Figure 2:
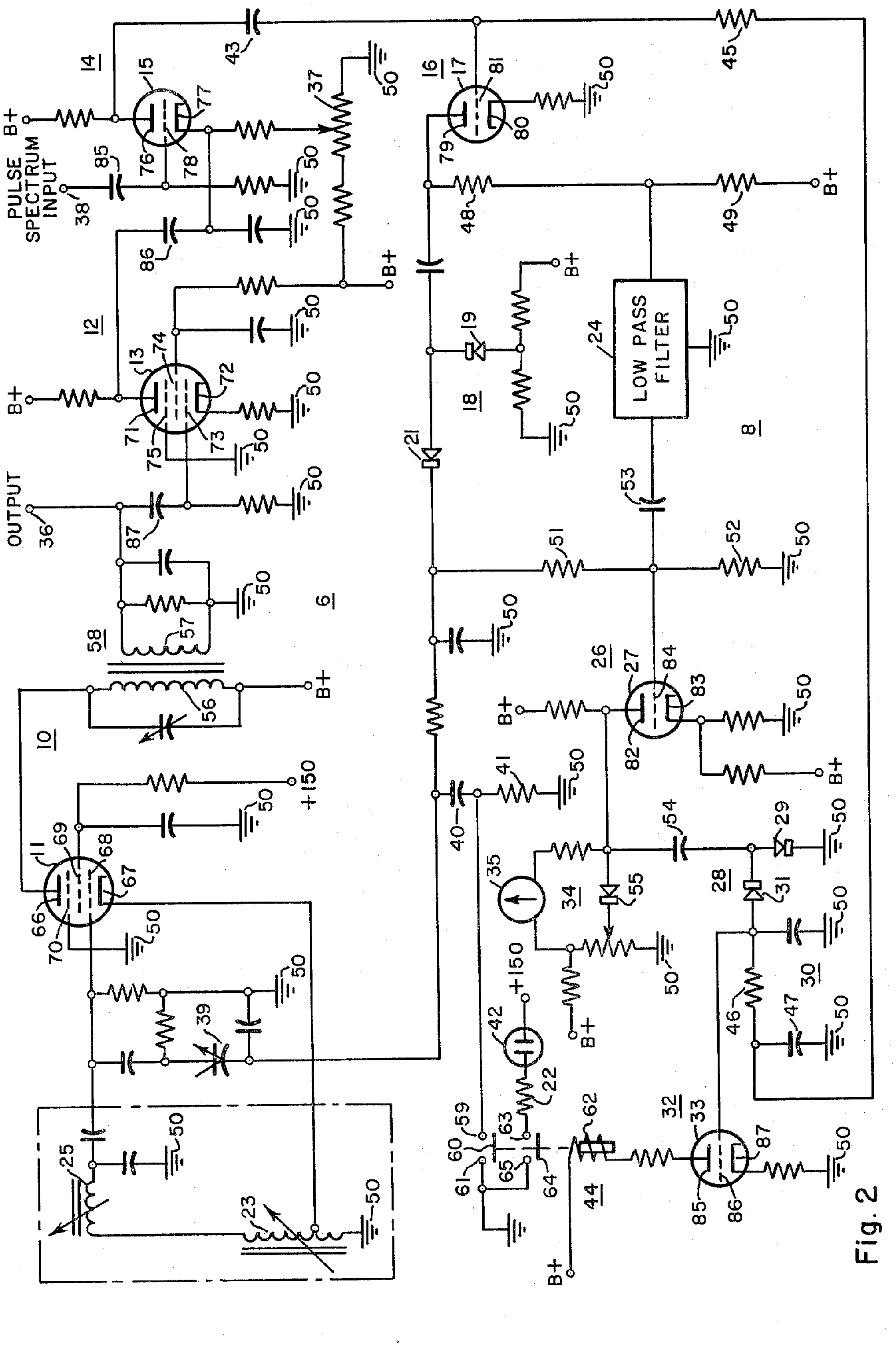
FIG. 2 is an electronic schematic diagram further illustrating the present invention.

Referring now to FIG. 2 illustrating the schematic diagram of the subject invention, the variable frequency oscillator (VFO) 10 consists of a Hartley type oscillator with a mechanical variable coil 23 for selecting a desired frequency; and a trimmer coil 25, and a voltage variable capacitor 39 in the tank circuit which is connected between the grid 68 and the cathode 67 of the pentode tube 11. The oscillations in the tank circuit are sustained by the pentode tube 11 and are transformer coupled to the buffer amplifier stage 12 by means of the transformer 58 with the primary winding 56 connected to the plate 66. The output signal from the VFO 10 is fed to an output terminal 36 from the secondary winding 57. A portion of the VFO 10 output signal is fed to the grid 73 of the pentode tube 13 by means of the coupling capacitor 87. The portion of the signal thus fed to the grid 73 is amplified by pentode tube 13 and fed from the plate 71 to the cathode 77 of the phase detector 14 via coupling capacitor 86.

The spectrum of reference frequencies are provided by the application of a 1 kc. pulse from a source, not shown, applied to terminal 38 of the phase detector 14. The pulse spectrum thus applied is fed to the grid 78 by means of capacitor 85. The cathode 77 of the pulse detector tube 15 is returned to a variable resistance 37 so that the phase detector may be biased on the proper position so that the level of the signal appearing at the plate 76 is directly related to the phase between the 1 kc. pulse spectrum including a selected harmonic and the output signal from the variable frequency oscillator 10. The signal appearing at the plate 76 of phase detector 14 is, as heretofore been stated, either a 1 kc. per second pulse which appears when the system is phase locked or a low audio beat signal when the system is in the unlocked condition. This signal is fed from the plate 76 through capacitor 43 to the input of the variable gain amplifier circuit 16 comprising the triode tube 17. The signal is applied to the gird 81 and fed from the plate 79 to a peak-to-peak rectifier circuit 18 comprising diodes 19 and 21. The D.C. voltage thus appearing at the cathode electrode of diode 21 then is the control voltage which is fed to the voltage variable capacitor 39 by a suitable coupling network shown in FIG. 2.

If the system is in a phase locked condition the output from the peak-to-peak rectifier circuit 18 will be sufficient to provide a D.C. control voltage to the voltage variable capacitor 39 to maintain the frequency of the variable frequency oscillator at its present setting.

If the system is in an unlocked condition the beat signal which is amplified by the triode 17 is sensed not only by the peak-to-peak rectifier circuit 18 but also by the low pass filter 24 at the common connection of resistors 48 and 49. The beat signal is passed through the low pass filter 24 and, by means of the coupling capacitor 53 connected to the grid electrode 84 is applied to the second amplifier 26 comprised of vacuum tube triode 27. The low audio beat signal is amplified in triode 27 and is applied to a second peak-to-peak rectifier circuit 28 comprised of diodes 29 and 31. The signal is fed from the plate 82 to the common connection of diodes 29 and 31 by means of capacitor 54. The rectified voltage thus appearing at the anode electrode of diode 31 is applied simultaneously to the lock up clamp circuit 32 and the time delay network comprised of resistor 46 and capacitor 47. As already stated, the D.C. voltage thus established due to the presence of the low audio beat signal from the low pass filter 24 provides a negative bias to the grid of the triode 33 forming the lock up clamp 32 to keep it in a cut off condition. Also the bias voltage thus being applied simultaneously to the R.C. time delay network 30 is returned to the grid 81 of the variable gain amplifier circuit 16 by means of resistor 45 completing the sweep and lock loop 8. The D.C. bias voltage, delayed by the time delay network 30, applied to the grid 81 of vacuum tube 17 causes the system to hunt or sweep to the nearest 1 kc. harmonic of the pulse spectrum.

At the instant the system initiates a phase lock condition where the VFO output voltage is in phase with a harmonic of the pulse spectrum the beat signal disappears at the grid 84 of the second amplifier tube 27. The voltage at the second peak-to-peak rectifier circuit 28 then rises from a negative bias voltage proportional to the beat signal and the bias voltage on the grid 86 of vacuum tube 33 becomes less allowing it to conduct. Conduction of vacuum tube 33 activates the relay 44 connected in the plate circuit of the lock up clamp circuit 32. Closing of the relay 44 due to the current flow in the coil 62 causes the indicator light 42 to be connected across the +150 volts by means of relay contacts 63, 64 and 65. Also activation of relay 44 returns capacitor 40 to ground 50 which, as already noted, reduces the phase loop frequency response of the phase loop 6 making it less susceptible to a hunting action due to spurious signals. The capacitor 40 in reality serves the purpose to filter the D.C. control voltage returned to the voltage variable capacitor 39 when the system is phase locked.

The metering circuit 34 is connected to the plate 82 of vacuum tube 27. A portion of the D.C. control voltage fed back to the voltage variable capacitor 39 is sampled by means of resistors 51 and 52. The voltage appearing across resistor 52 with respect to ground is applied to the grid 84 and amplified in triode 27, acting as a D.C. amplifier, to give a reading on meter 35 which is indicative of the D.C. control voltage. Trimming of the VFO 10 can be accomplished by varying the adjustable coil 25 by monitoring the meter 35 without changing the oscillator frequency but merely trimming the oscillator to its optimum condition for the selected frequency.

By way of example, a situation will be considered wherein it is desired to have the variable frequency oscillator 10 provide an output frequency of 3 mc. Initially coil 23 may be adjusted to provide the 3 mc. signal, if the VFO 10 thereafter provides the 3 mc. signal exactly, the phase detector 14 receiving the VFO 10 output signal and the reference 1 kc. pulse, will provide an output signal comprised of output pulses having a 1 kc. rate with the pulses having substantially equal amplitudes, indicative of an in-phase condition. The variable gain amplifier 16 receiving the output signal from the phase detector 14 provides an output signal which is rectified and filtered to obtain a D.C. voltage. The resulting D.C. voltage is applied to the variable capacitor 39 which tends to maintain the oscillator frequency at the desired 3 mc. repetition rate. With the in-phase condition present, low pass filter 24 receives no beat signal to pass on to amplifier 26 which consequently acts as a D.C. amplifier due to the presence of a D.C. voltage from diode 21, appearing on its grid 84. The response of the metering circuit 34 to the D.C. output signal from the amplifier 26 will indicate this in-phase or phase lock condition. Suppose now for some reason the VFO frequency increases such that it is, for example, 100 cycles over the 3 mc. desired frequency. The frequency applied to the phase detector 14 will therefore be out of phase with the reference signal, thus producing a low audio beat signal as heretofore explained, which is applied to the input of variable gain amplifier 16. The output from the variable gain amplifier 16 is applied to the rectifier circuit 18 to provide a D.C. control voltage which, applied to variable capacitor 39, tries to correct the out of phase condition. In addition, the output of the variable gain amplifier 16 is applied to the low pass filter 24, the output of which, is the low audio beat signal component of the output signal from the variable gain amplifier 16. The low audio beat signal, signifying an error and out of lock condition, is applied to the grid 84 of the amplifier 26, the output of which is coupled through capacitor 54 to the rectifier circuit 28 to provide a D.C. bias voltage which will be applied to the grid 81 of the variable gain amplifier 16. As was stated, the D.C. bias voltage is delayed in time by the R.C. network 30, including capacitor 47 and resistor 46. As the error persists, the charge on capacitor 47 builds up and consequently the D.C. bias voltage increases which, applied to the variable gain amplifier 16, decreases the gain thereof causing the output signal to decrease, thus decreasing the D.C. control voltage being applied to the variable capacitor 39. The voltage at the anode of diode 31 causes the amplifier 33 to cutoff thus removing capacitor 40 from ground and changing the frequency response of the phase loop. The sweeping action of the D.C. control voltage applied to the variable capacitor 39 tends to change, for example, decrease the output frequency of the VFO 10 to again bring it into a phase lock condition which will eliminate the beat signal. The time delay network, particularly capacitor 47, of the sweep and lock loop 8 loses its charge, the D.C. bias voltage is removed from the variable gain amplifier, capacitor 40 again is connected to ground and the system tends to operate as previously explained. Suppose now that the output frequency of the VFO 10 decreases by 200 cycles, the decrease again causing a low audio beat signal in the output of the phase detector 14 which, when applied to the variable gain amplifier 16, produces an output signal having the low audio beat signal component. This latter signal is applied to the low pass filter 24 causing the amplifier 26 to produce the D.C. bias voltage at the output of the rectifier circuit 28. The D.C. bias voltage applied back to the variable gain amplifier 16 after a predetermined time delay, decreases the gain thereof causing a decrease in the D.C. control voltage applied to variable capacitor 39 to initiate a sweeping action. As the bias to the variable gain amplifier 16 is increased the output signal thereof will continue to decrease, the voltage applied to the variable capacitor 39 decreases, decreasing the VFO 10 frequency thereby bringing it to an even more out of lock condition. As the charge builds up on capacitor 47 of the time delay network a point will be reached wherein the variable gain amplifier will cutoff and in so doing the plate voltage thereof will rise to essentially B+, the increase being coupled to the variable capacitor 39 which suddenly changes the frequency of the VFO 10 to a point above the desired 3 mc. rate. With the frequency above the desired rate an audio beat signal is again produced which causes the D.C. control voltage to decrease to eventually obtain an in lock condition as was previously explained.

What has been described therefore is a variable frequency oscillator system operating over a continuous range of 1 mc. in discrete steps of 1 kc. That is, over the 1 mc. tuning range there are 1000 discrete points to which the variable frequency oscillator may be tuned. This variable frequency oscillator moreover is phase locked to a spectrum of frequencies provided by a 1 kc. pulse applied to the phase detector which provides a correctional voltage to a voltage variable capacitor. Also included is a simple and reliable sweep and locking circuit which automatically moves and phase locks the variable frequency oscillator to the nearest harmonic of the 1 kc. spectrum.

Whereas the invention has been shown and described with respect to a preferred embodiment thereof which gives satisfactory results, it should be understood that changes may be made and equivalents substituted without departing from the spirit and scope of the invention.

We claim as our invention:

1. A phase locked variable frequency oscillator system comprising: a variable frequency oscillator including frequency controlling means; a phase detector having applied thereto a signal from said variable frequency oscillator and a reference input signal for providing an output signal functionally related to the phase difference between said signals; amplifier means having output means and input means for receiving the output signal from said phase detector; first circuit means connected to the output of said amplifier means for deriving a control signal for controlling said frequency controlling means; second circuit means connected to the output of said amplifier means for deriving a D.C. bias voltage when a phase difference exists between the signals applied to said phase detector; and means, including time delay means, for applying said D.C. bias voltage to the input of said amplifier means to change the gain thereof in accordance with the magnitude of said bias voltage to thereby cause said control signal and said D.C. bias voltage to vary as long as said phase difference exists.

2. The apparatus of claim 1 wherein said frequency controlling means comprises a voltage variable reactance.

3. The apparatus of claim 1 wherein said frequency controlling means comprises a voltage variable capacitor.

4. A phase locked variable frequency oscillator system comprising: a phase loop including a variable frequency oscillator having frequency controlling means, a phase detector having applied thereto a signal from said variable frequency oscillator and a reference pulse input signal for providing an output signal, amplifier means having output means and input means for receiving the output signal from said phase detector, and first circuit means connected to the output of said amplifier means for deriving a control signal for controlling said frequency controlling means; a sweep and lock loop including said amplifier means, second circuit means connected to the output of said amplifier means for deriving a D.C. bias voltage when a phase difference exists between the signals applied to said phase detector, means for applying said D.C. bias to said amplifier means for controlling the amplifying function thereof, and means responsive to said D.C. bias voltage for changing the frequency response of said phase loop.

5. A variable frequency oscillator control system comprising: a variable frequency oscillator including a variable reactance for controlling the frequency of oscillation thereof; comparison means having an input reference signal applied there to in addition to a signal from the said variable frequency oscillator for providing a first type output signal when said signals are in-phase and a second type output signal when said signals are out of phase; first amplifier means having input means for receiving the output signals from said comparison means and having output means for providing a control signal to said variable reactance means in response to an input signal; filter means operatively connected to said output means for passing only output signals of said second type; means for receiving any signals from said filter means for providing a D.C. bias voltage; and time delay means for time delaying said bias voltage, said time delay means operatively connected to said input means of said first amplifier means for varying the gain of said first amplifier means.

6. A variable frequency oscillator control system comprising; a variable frequency oscillator tunable over a preselected frequency range and including a variable reactance for controlling the frequency of oscillation thereof; phase detector means having an input pulse reference signal applied thereto in addition to a signal from the said variable frequency oscillator for providing a first type pulse output signal when said signals are in-phase and a low audio beat output signal when said signals are out of phase; first amplifier means having input means for receiving the output signals from said phase detector means and having output means for providing a control signal to said variable reactance means in response to an input signal; filter means operatively connected to said output means for passing only said audio beat output signals; second amplifier means for receiving any signals from said filter means for providing an output signal; means operatively connected to said second amplifier means for rectifying any output signals therefrom to obtain a bias voltage; and time delay means for time delaying said bias voltage, said time delay means operatively connected to said input means of said first amplifier means for applying said time delayed bias voltage to change the gain of said first amplifier means in a manner tending to reduce the output signal therefrom thus causing said control signal to vary said variable reactance.

7. A variable frequency oscillator system comprising: a phase control circuit including a variable frequency oscillator having a reactance means for governing the output frequency thereof, a phase detector having a first input for receiving a signal from said variable frequency oscillator and a second input for receiving an input signal comprising a series of pulses having a repetition rate less than the output frequency of said oscillator to provide a first type pulse output signal when said signals applied to said phase detector are in-phase, and to provide a second type output signal when said signals applied to said phase detector are out of phase, and a variable gain amplifier responsive to output signals provided by said phase detector for deriving a control signal to vary said reactance means; a sweep and lock circuit including said variable gain amplifier means, means for obtaining a D.C. bias voltage in response to said second type output signal including means for applying said D.C. bias voltage to said variable gain amplifier after a predetermined time delay for decreasing the gain thereof as said D.C. bias increases; a decrease in gain causing the output signal of said variable gain amplifier to decrease thereby sweeping said control signal in a first direction; and means for altering the frequency response of said phase control circuit.

8. A variable frequency oscillator system comprising: a phase control circuit including a variable frequency oscillator having a voltage controlled reactance for governing the output frequency thereof, a phase detector having a first input for receiving a signal from said variable frequency oscillator and a second input for receiving an input signal comprising a series of pulses having a repetition rate less than the output frequency of said oscillator to provide an output signal comprised of output pulses, with the pulses having substantially equal amplitudes when said signals applied to said phase detector are in-phase, and to provide an output audio frequency beat signal when said signals applied to said phase detector are out of phase, a variable gain amplifier connected to said phase detector for providing output signals in response to output signals provided by said phase detector, first rectifying means connected to the output of said variable gain amplifier to rectify the output signals therefrom, a filter capacitor connected between the output of said rectifying means and ground potential for deriving a D.C. control voltage thereacross for controlling said voltage controlled reactance; a sweep and lock circuit including said variable gain amplifier, filter means connected to said variable gain amplifier for passing only said output audio frequency beat signal, amplifier means connected to receive any signal, passed by said filter means for providing a bias signal, means including time delay and second rectifying means for obtaining a D.C. bias voltage from the output of said amplifier means, means for applying said D.C. bias voltage to said variable gain amplifier after a predetermined time delay to decrease the gain thereof as said D.C. bias increases, a decrease in gain causing the output signal of said variable gain amplifier to decrease said control signal applied to said voltage controlled reactance, and means for inserting additional impedance means between said filter capacitor and said ground potential when said out of phase condition occurs.

References Cited by the Examiner

UNITED STATES PATENTS

| | | | |
|---|---|---|---|
| 2,828,419 | 3/58 | Gruen | 331—17 |
| 2,851,602 | 9/58 | Cramwinckel et al. | 331—28 XR |
| 2,856,529 | 10/58 | Mielke | 331—4 |
| 2,924,783 | 2/60 | Shapiro et al. | 331—4 |
| 2,930,001 | 3/60 | Salmet | 331—19 XR |
| 2,972,720 | 2/61 | Hume | 331—4 |

ROY LAKE, *Primary Examiner.*

JOHN KOMINSKI, *Examiner.*